(12) United States Patent
Namiki

(10) Patent No.: US 9,992,870 B2
(45) Date of Patent: Jun. 5, 2018

(54) SUBSTRATE UNIT, TIMEPIECE, AND SUBSTRATE BONDING METHOD

(71) Applicant: CASIO COMPUTER CO., LTD., Shibuya-ku (JP)

(72) Inventor: Koji Namiki, Higashimurayama (JP)

(73) Assignee: CASIO COMPUTER CO., LTD., Tokyo (JP)

( * ) Notice: Subject to any disclaimer, the term of this patent is extended or adjusted under 35 U.S.C. 154(b) by 23 days.

(21) Appl. No.: 15/009,422

(22) Filed: Jan. 28, 2016

(65) Prior Publication Data

US 2016/0252887 A1    Sep. 1, 2016

(30) Foreign Application Priority Data

Feb. 27, 2015 (JP) ................. 2015-039024

(51) Int. Cl.

| G04G 17/04 | (2006.01) |
|---|---|
| G04G 17/06 | (2006.01) |
| H05K 1/11 | (2006.01) |
| H05K 1/14 | (2006.01) |
| H05K 3/36 | (2006.01) |

(52) U.S. Cl.
CPC ............ *H05K 1/115* (2013.01); *G04G 17/04* (2013.01); *G04G 17/06* (2013.01); *H05K 1/113* (2013.01); *H05K 1/141* (2013.01); *H05K 3/368* (2013.01); *H05K 1/117* (2013.01); *H05K 2201/09027* (2013.01); *H05K 2201/09181* (2013.01)

(58) Field of Classification Search
CPC ........ G04G 17/00; G04G 17/02; G04G 17/04; G04G 21/00; H05K 1/112; H05K 1/113; H05K 1/117; H05K 1/141; H05K 1/142; H05K 1/144; H05K 2201/181; H05K 2201/9172
See application file for complete search history.

(56) References Cited

U.S. PATENT DOCUMENTS

| 3,991,463 | A | * | 11/1976 | Squitieri | ................ G04G 17/06 29/423 |
|---|---|---|---|---|---|
| 4,169,642 | A | * | 10/1979 | Mouissie | ............... G04G 17/02 257/E23.086 |
| 4,736,521 | A | * | 4/1988 | Dohya | ................ H01L 23/5383 174/255 |

(Continued)

FOREIGN PATENT DOCUMENTS

| JP | S 61-183566 | 11/1986 |
|---|---|---|
| JP | H 03-231488 | 10/1991 |

(Continued)

OTHER PUBLICATIONS

JP2005130055 English translation, retrieved from the Internet Aug. 31, 2017.*

(Continued)

*Primary Examiner* — Vit W Miska
(74) *Attorney, Agent, or Firm* — Cozen O'Connor

(57) ABSTRACT

A substrate unit includes a first substrate and a second substrate, the second substrate including a superimposed portion superimposed on at least part of the first substrate, and bonding portions located in a plurality of positions at least defining a plane in the superimposed portion, the bonding portions bonded to the first substrate.

14 Claims, 7 Drawing Sheets

(56) References Cited

U.S. PATENT DOCUMENTS

| | | | | |
|---|---|---|---|---|
| 4,795,079 A * | 1/1989 | Yamada | .................. | H05K 3/363 |
| | | | | 174/88 R |
| 4,910,415 A * | 3/1990 | Yoshimura | ............. | G04C 10/02 |
| | | | | 307/147 |
| 5,418,691 A * | 5/1995 | Tokura | ................... | H01R 12/62 |
| | | | | 174/254 |
| 5,883,335 A * | 3/1999 | Mizumoto | ........ | H01L 23/49827 |
| | | | | 174/266 |
| 6,531,661 B2 * | 3/2003 | Uchikawa | ............ | H05K 3/4602 |
| | | | | 174/255 |
| 2006/0226537 A1 * | 10/2006 | Okabe | .................. | H01L 21/486 |
| | | | | 257/700 |
| 2008/0057743 A1 * | 3/2008 | Sogabe | .............. | H01R 43/0235 |
| | | | | 439/65 |
| 2008/0284017 A1 * | 11/2008 | Lee | ..................... | H01L 21/6835 |
| | | | | 257/738 |
| 2015/0168922 A1 * | 6/2015 | Wanikawa | ............ | H01L 31/042 |
| | | | | 136/244 |
| 2016/0374200 A1 * | 12/2016 | Lee | ........................ | H05K 1/118 |

FOREIGN PATENT DOCUMENTS

| | | |
|---|---|---|
| JP | 2005-130055 | 5/2005 |
| JP | 2007-227229 | 9/2007 |

OTHER PUBLICATIONS

Office Action dated Jan. 31, 2017 which issued in the corresponding Japanese Patent Application No. 2015-039024.

* cited by examiner

SUBSTRATE UNIT, TIMEPIECE, AND SUBSTRATE BONDING METHOD

CROSS-REFERENCE TO RELATED APPLICATION

This application is based upon and claims the benefit of priority from the prior Japanese Patent Application No. 2015-039024, filed Feb. 27, 2015 the entire content of which is incorporated herein by reference.

BACKGROUND OF THE INVENTION

The present invention relate generally to a substrate unit, a timepiece, and a substrate bonding method.

A technique is used for connecting a plurality of substrates that are used as a substrate structure for a watch or the like (for example, see Jpn. Pat. Appln. KOKAI Pub. No. 2007-227229). For example, a known substrate structure has a structure in which one substrate is superimposed on part of an upper surface of the other substrate, and the substrates are electrically and mechanically connected using a pair of connectors. For example, an entire circumference of one substrate is provided with a guide pin extending from the substrate surface toward the other opposed substrate, and the other substrate is provided with a guide hole in a position corresponding to the guide pin. The guide pin is inserted into the guide hole, and the connectors are fitted with each other, to electrically and mechanically connect one substrate to the other substrate.

The substrate structure in which one substrate is disposed on the other substrate and is connected via connectors requires a large space for connection, and is difficult to miniaturize.

The present invention is a substrate, a timepiece, and a substrate bonding method that enables miniaturization.

SUMMARY OF THE INVENTION

An embodiment of the present invention is a substrate unit comprising a first substrate and a second substrate, the second substrate comprising a superimposed portion superimposed on at least part of the first substrate, and bonding portions located in a plurality of positions at least defining a plane in the superimposed portion, the bonding portions bonded to the first substrate.

DESCRIPTION OF THE PREFERRED EMBODIMENT

First Embodiment

The following is an explanation of a configuration of a timepiece 10 according to a first embodiment of the present invention, with reference to FIG. 1 to FIG. 7. The drawings properly schematically illustrate the configuration in an enlarged or reduced manner, or with constituent elements omitted.

Figure 1:
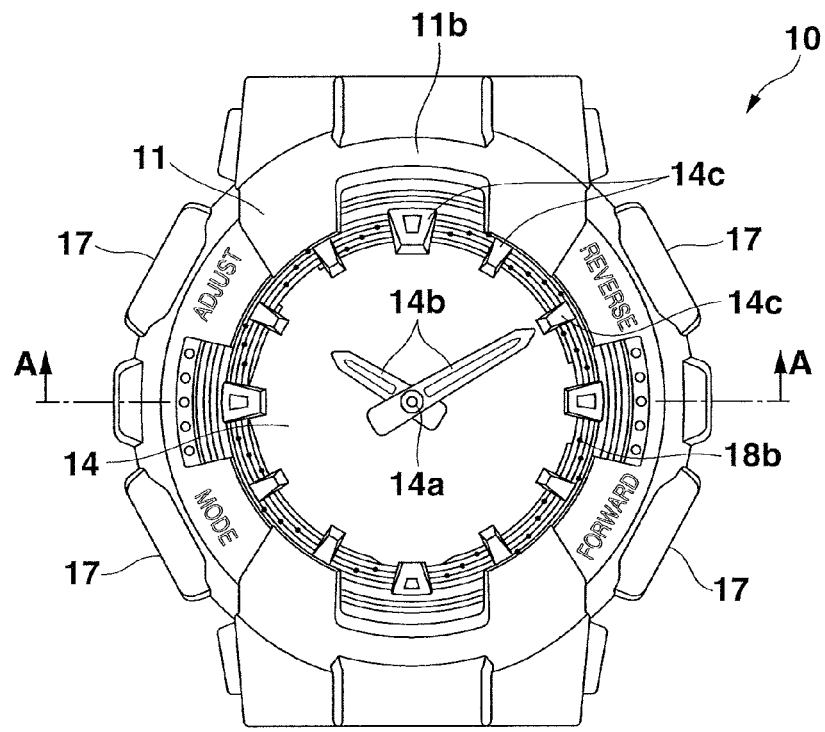
FIG. 1 is a plan view illustrating a configuration of a timepiece according to a first embodiment.
Figure 2:
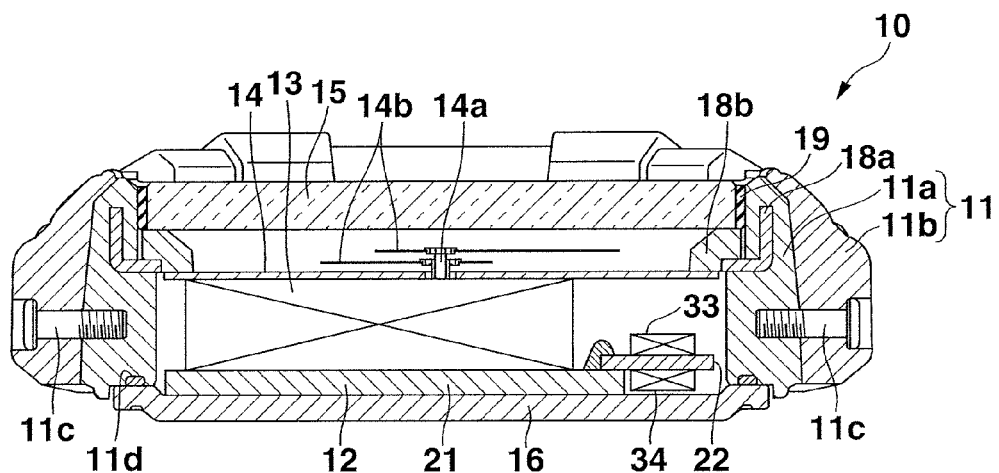
FIG. 2 is a cross-sectional view illustrating the configuration of the timepiece.
Figure 3:
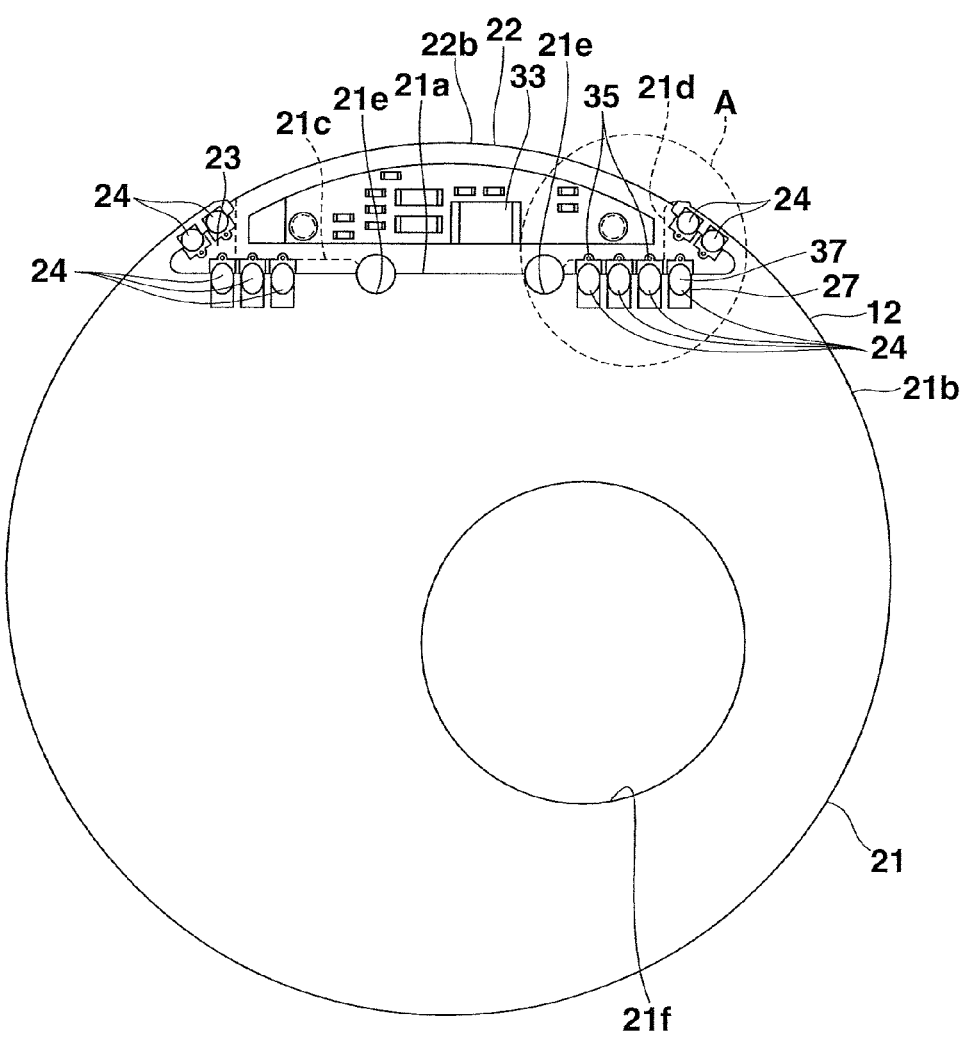
FIG. 3 is a plan view illustrating a substrate unit of the timepiece.
Figure 4:
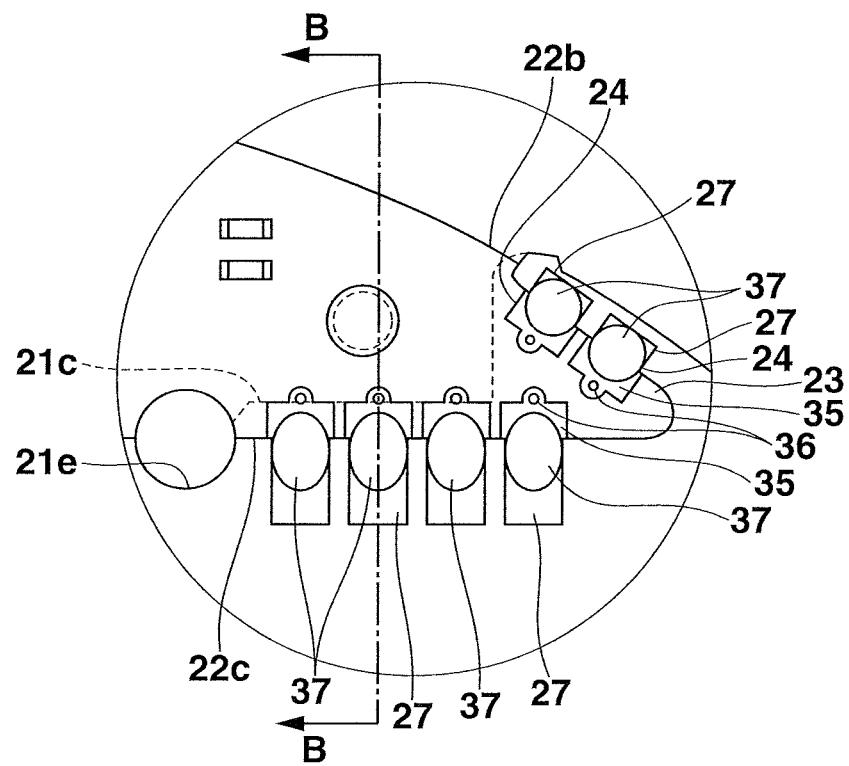
FIG. 4 is an enlarged plan view of a part of FIG. 3.
Figure 5:
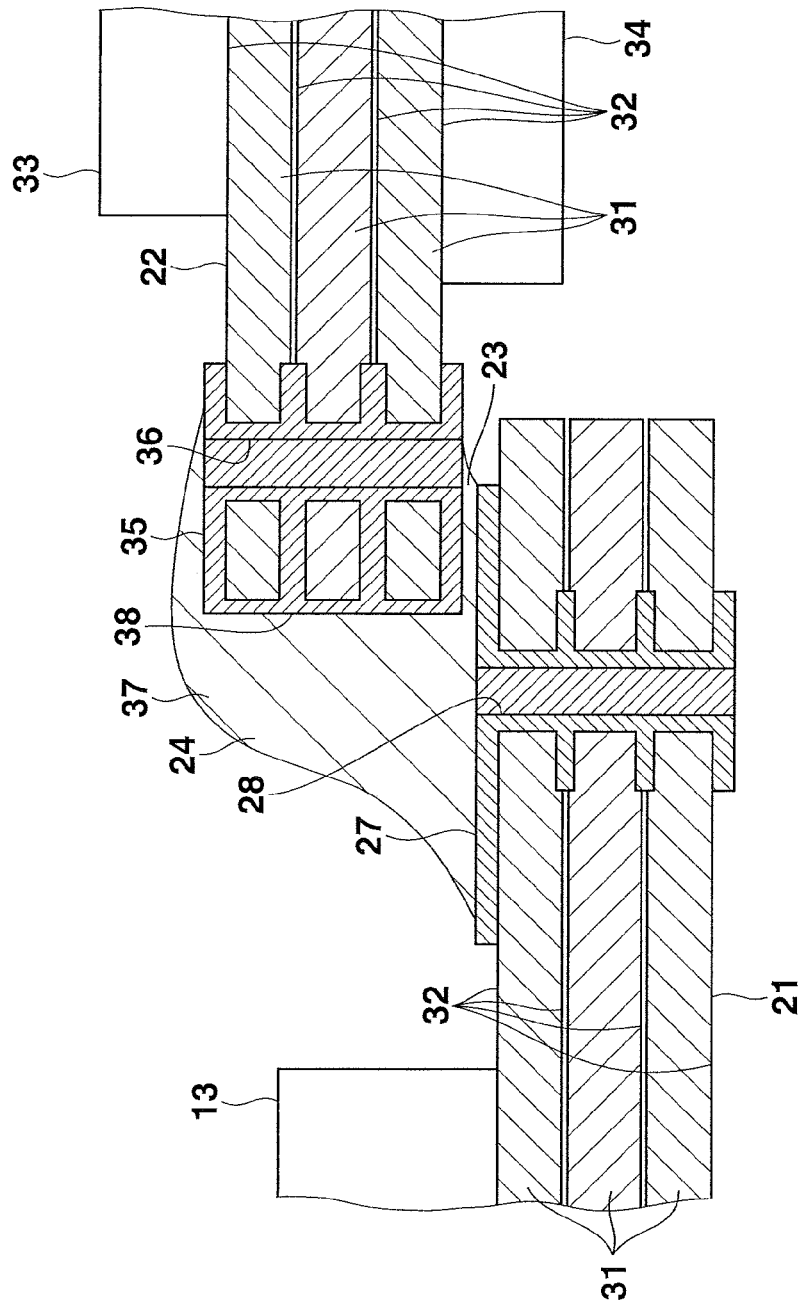
FIG. 5 is a cross-sectional view taken along line B-B of FIG. 4.
Figure 6:
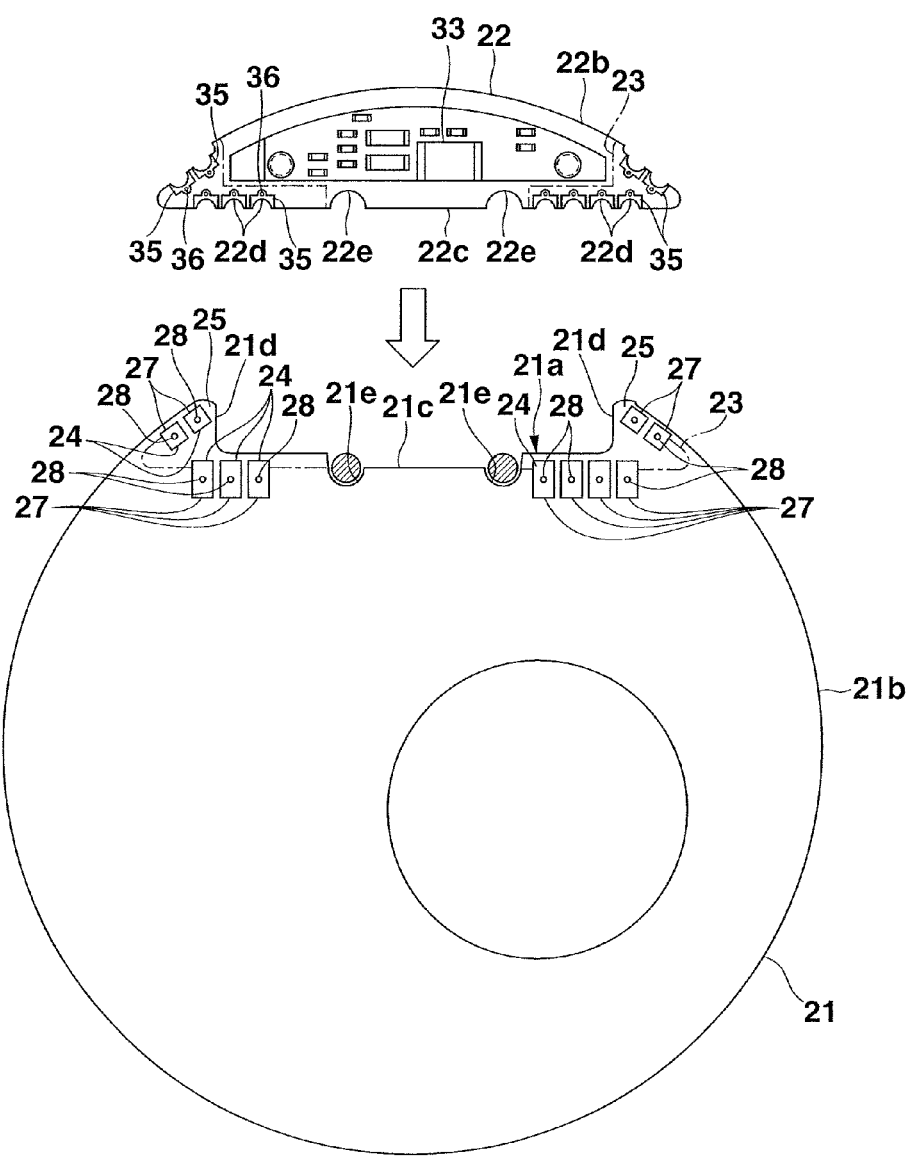
FIG. 6 is an exploded view of the substrate unit.
Figure 7:
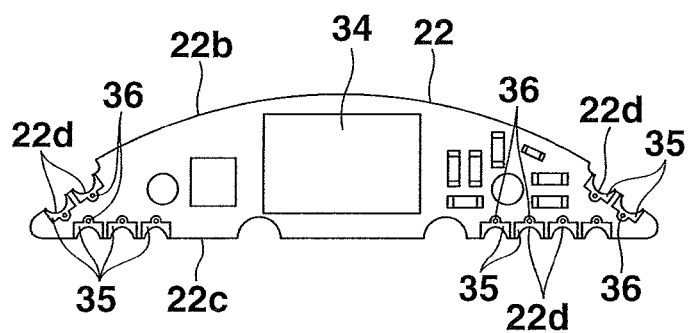
FIG. 7 is a bottom view of a module substrate according to the embodiment.

FIG. 1 is a plan view illustrating a configuration of the timepiece 10, and FIG. 2 is a cross-sectional view illustrating the configuration of the timepiece 10. FIG. 3 is a plan view illustrating a substrate structure of the timepiece 10, and FIG. 4 is an enlarged view of a part of FIG. 3. FIG. 5 is a cross-sectional view taken along line B-B of FIG. 4, and FIG. 6 is an exploded view of the substrate structure. FIG. 7 is a bottom view of a module substrate 22.

As illustrated in FIG. 1 and FIG. 2, the timepiece 10 is a wristwatch. The timepiece 10 comprises a wristwatch case 11 forming an outer frame, a substrate unit 12 serving as a substrate structure provided in the wristwatch case 11, a watch module 13 mounted on the substrate unit 12, a dial 14 disposed on the watch module 13 in the wristwatch case 11, a watch glass 15 covering a part above the dial 14, a rear cover 16 that covers the rear side of the substrate unit 12, and a plurality of switches 17 arranged on the outer circumference of the wristwatch case 11.

The wristwatch case 11 comprises an annular main body case 11a, and an exterior case 11b disposed outside the main body case 11a.

The main body case 11a is formed in an annular shape, and has an inside space to contain the watch module 13 and the like. The circular substrate 12 is contained in a lower portion of the containing space of the main body case 11a.

The dial 14 is disposed in an upper opening of the main body case 11a. A reinforcing member 18a and a parting member 18b are arranged at an outer circumferential portion of the dial 14 and at the inner circumferential edge of the main body case 11a. A groove is formed in a rear surface of the main body case 11a, and a waterproof ring 11d is fitted to seal the space with the rear cover 16 in an airtight manner.

The exterior case 11b is provided on the outer circumference of the main body case 11a. The exterior case 11b is fixed to the main body case 11a with connection members such as screws 11c.

A through hole is formed in the central portion of the dial 14, and a pointer shaft 14a is inserted into the through hole. A plurality of pointers 14b supported by the rotatable pointer shaft 14a are arranged on the dial 14. The pointers 14b are, for example, an hour hand, a minute hand, and a second hand. The parting member 18b provided with various hour markers 14c is disposed in the outer circumferential portion on the front surface of the dial 14.

A part above the dial 14 is covered with the transparent watch glass 15 having a disk shape. The watch glass 15 is supported on the parting member 18b at the inner circumferential edge of the upper opening of the main body case 11a. A packing 19 is interposed between the outer circumference of the watch glass 15 and the inner circumferential edge of the main body case 11a.

The switches 17 are pushed in by the operator to perform mode switching of the watch module 13 and correct the time.

As illustrated in FIG. 3 to FIG. 6, the substrate unit 12 comprises a mother substrate 21 serving as a first substrate, and a module substrate 22 serving as a second substrate. The substrate unit 12 comprises a superimposed portion 23 in which part of the mother substrate 21 and part of the module substrate 22 are superimposed on each other. The superimposed portion 23 of the substrate unit 12 is provided with a plurality of bonding portions 24 in which the mother substrate 21 and the module substrate 22 are bonded to each other.

As illustrated in FIG. 5, the mother substrate 21 is a multi-layer substrate having a four-layer structure comprising base materials 31 serving as three layers, and predetermined wiring patterns 32 serving as four layers that are formed between the base materials 31 and both surfaces thereof. The watch module 13 comprising various electronic components is mounted on the mother substrate 21.

The mother substrate 21 has a disk shape comprising a cut-out portion 21a that is recessed in a substantially rectangular shape in part of the outer circumference thereof. The outer circumferential edge of the mother substrate 21 comprises an arc-shaped curved edge portion 21b having a center angle of 180° or more, an end edge portion 21c having a straight-line shape and positioned further to the inside than both ends of the curved edge portion 21b in the diameter direction, and connecting edge portions 21d extending inward from the respective ends of the curved edge portion 21b to both ends of the end edge portion 21c. The end edge portion 21c and the connecting edge portions 21d form the circumferential edge of the cut-out portion 21a. Both ends of the curved edge portion 21b and the connecting edge portions 21d form circumferential edges of projecting pieces 25.

The mother substrate 21 comprises a pair of projecting pieces 25 projecting outward from both sides of the end edge portion 21c. The end edge portion 21c is provided with guide recesses 21e to be engaged by the circumferences of positioning pins for positioning with the module substrate 22. An opening 21f in which a battery is disposed is formed in a predetermined position of the mother substrate 21.

Part of the outer circumferential edge of the mother substrate 21 forms the superimposed portion 23 superimposed on the module substrate 22. The superimposed portion 23 is provided with bonding portions 24 in a plurality of positions defining a plane.

The bonding portions 24 are provided in a row along with a predetermined direction in the end edge portion 21c, and provided in two positions in each of the projecting pieces 25. In the present embodiment, three bonding portions 24 are arranged in a row on one end side of the end edge portion 21c, and four bonding portions 24 are arranged in a row on the other end side of the end edge portion 21c. In addition, two bonding portions 24 are arranged in positions displaced from the direction of the bonding portions 24 of the end edge portion 21c, and along a direction crossing the direction of the end edge portion 21c, and on each of the end portions of the outer circumferential edge of the curved edge portion 21b, that is, in each of the projecting pieces 25. In the bonded state, the bonding portions 24 surround the outer circumferential portion of the module substrate 22.

The mother substrate 21 comprises a first bonding pad 27 and a first via hole 28, in each of the bonding portions 24.

Each first bonding pad 27 is formed of a metal layer, and connected to each wiring pattern 32 of the substrate. Each first bonding pad 27 is, for example, a signal pad, a GND pad, or a FG pad. Each first bonding pad 27 has a rectangular plate shape in top view, and connected to the wiring pattern 32 of each layer via the first via hole 28.

Each first via hole 28 is a through hole that extends through the mother substrate 21 provided with the first bonding pad 27 in each bonding portion 24, and provided with a metallized layer formed therein.

The module substrate 22 is a multi-layer substrate with a four-layer structure comprising base materials 31 serving as three layers, and predetermined wiring patterns 32 serving as four layers formed between the base materials 31 and on both surfaces. A communication antenna 33 for Bluetooth communication or ANT communication or the like is mounted on the front surface of the module substrate 22. A communication IC 34 (communication integrated circuit) or the like is mounted on the rear surface of the module substrate 22.

The module substrate 22 is a plate with a predetermined shape and having an external circumference formed of an arc-shaped curved edge portion 22b having a center angle less than 180° and an end edge portion 22c having a straight-line shape and connecting both ends of the curved edge portion 22b. The module substrate 22 is disposed on the cut-out portion 21a of the mother substrate 22, and covers the edge portion of the cut-out portion 21a. The end edge portion 22c is provided with guide recesses 22e to be engaged with the circumferences of positioning pins in positioning with the mother substrate 21.

Part of the outer edge of the module substrate 22 forms the superimposed portion 23 superimposed on the mother substrate 21. The superimposed portion 23 is provided with bonding portions 24 in a plurality of positions defining a plane. In other words, the bonding portions 24 define a plane that supports the module substrate 22 on the mother substrate 21.

In the module substrate 22, the bonding portions 24 are provided in a row along with the end edge portion 22c, and provided in two positions in each of both ends of the curved edge portion 22b. In the present embodiment, three bonding portions 24 are arranged in a row on one end side of the end edge portion 22c, and four bonding portions 24 are arranged in a row on the other end side of the end edge portion 22c of the module substrate 22. In addition, two bonding portions 24 are arranged in positions displaced from the direction of the bonding portions 24 of the end edge portion 22c, and along a direction crossing the direction of the end edge portion 22c, and on each of the end portions of the curved edge portion 22b. The bonding portions 24 surround the outer circumferential portion of the module substrate 22.

The module substrate 22 comprises a second bonding pad 35 and a second via hole 36, in each of the bonding portions 24.

A curved recess 22d forming a curved surface having a semicircular shape in cross-sectional view is formed at an end edge of each of the bonding portions 24 of the module substrate 22. With this structure, an end surface in each bonding portion 24 of the module substrate 22 is curved in a semicircular shape in cross-sectional view. The end surface of each bonding portion 24 of the module substrate 22 is metalized. An end surface metal 38 is formed on the end surface comprising the curved recess 22d in each bonding portion of the module substrate 22. The end surface metal 38 forms part of the second bonding pad 35.

Each second bonding pad 35 is formed of a metal layer formed on the surface of the base materials 31 and connected to each wiring pattern 32 of the substrate, and the end surface metal 38 connected thereto. Each second bonding pad 35 is, for example, a signal pad, a GND pad, or a FG pad. Each second bonding pad 35 is connected to the wiring pattern 32 of each layer via the second via hole 36.

Each second via hole 36 is a through hole that extends through the module substrate 22 provided with the second bonding pad 35 in each bonding portion 24, and provided with the metal layer formed therein.

In the substrate unit 12, the front surface of the superimposed portion 23 of the mother substrate 21 is opposed to and superimposed on the rear surface of the superimposed portion 23 of the module substrate 22, and the module substrate 22 and the mother substrate 21 are electrically and mechanically connected in the bonding portions 24. In the substrate unit 12 in the bonded state, the arc-shaped curved edge portion 22b continues, and the outer circumference of the substrate unit 12 has a circular shape in a plan view.

Each of the bonding portions 24 is provided with a solder 37 to spread over the first bonding pad 27 and the second bonding pad 35. Specifically, the mother substrate 21 and the module substrate 22 are soldered in each bonding portion 24, and electrically and mechanically connected to each other.

The solder 37 is formed to extend over a region comprising the surface and part of the end surface of the bonding pad of the module substrate 22 and part of the surface of the bonding pad of the mother substrate 21. Solder 37 is also disposed in a space between the rear surface of the mother substrate 21 and the front surface of the module substrate 22. Specifically, the solder 37 is in close contact with the rear surface of the mother substrate 21 and the front surface of the module substrate 22. The solder 37 has a function of electrically and mechanically connecting the substrates 21 and 22, and a function of reinforcing the connection.

In the substrate unit 12, the mother substrate 21 extends to one side from the superimposed portion 23, and the module substrate 22 extends to the other side from the superimposed portion 23. Specifically, the substrate unit 12 has a cantilever supporting structure in which part of one side of the module substrate 22 is supported by the mother substrate 21.

The following is an explanation of a method for manufacturing the substrate unit 12 having the above structure and a substrate bonding method.

First, the mother substrate 21 and the module substrate 22 are manufactured separately. A method for manufacturing the mother substrate 21 comprises, for example, stacking three base materials 31 with predetermined wiring patterns 32 formed in advance, cutting the guide recesses 21e and the cut-out portion 21a in predetermined shapes in the outer circumferential edge thereof, and thereafter forming the first via holes 28 by drilling or laser processing in the outer circumferential edge portion. Thereafter, the metal layer is formed in the predetermined position in the mother substrate 21 by plating or the like, to form a plurality of first bonding pads 27, and to metallize the inside of each first via hole 28.

A method for manufacturing the module substrate 22 comprises, for example, stacking three base materials 31 with predetermined wiring patterns 32 formed in advance, and cutting the module substrate 22 to form the guide recesses 22e in a predetermined shape. Thereafter, the second via holes 36 and the curved recesses 22d are formed by drilling or laser processing in the outer circumferential edge portion. Thereafter, the metal layer is formed in the predetermined position by plating or the like, to form a plurality of second bonding pads 35 comprising the end surface metal 38 in the curved recesses 22d, and to metallize the inside of each second via hole 36.

Next, the guide recesses 21e and 22e are engaged with the positioning pins serving as separate members, to position the mother substrate 21 and the module substrate 22, and to dispose and superimpose the superimposed portions 23. In the superimposition, a space is formed between the bonding surfaces serving as the superimposed portions 23 of the mother substrate 21 and the module substrate 22 by space forming means such as spacers. In the positioned state, part of each second bonding pad 35 of the module substrate 22 is disposed on part of the upper surface of each first bonding pad 27 of the mother substrate 21. Thereafter, predetermined portions are soldered in the state where the superimposed portions 23 are superimposed, to electrically and mechanically bond the mother substrate 21 to the module substrate 22. In the bonding, the solder 37 is formed to cover a region comprising upper surfaces and end surfaces of the substrates 21 and 22 in each bonding portion 24. The solder 37 also enters the space between the substrates 21 and 22, and is brought into close contact with the surfaces of the substrates 21 and 22, to secure high bonding strength.

As described above, the module substrate 22 is bonded onto and supported by the mother substrate 21, in a plurality of positions defining a plane, that is, the bonding portions 24 in a plurality of positions comprising the end edge portions 21c and 22c, and both end portions of the curved edge portions 21b and 22b.

Various electronic components are mounted on the substrates 21 and 22 of the substrate unit 12 having the above structure. For example, a watch microcomputer (not illustrated) and electronic components are mounted on the mother substrate 21. For example, the communication antenna 33 for Bluetooth communication or the like, and electronic components are mounted on the front surface of the module substrate 22. For example, the communication IC 34 is mounted on the rear surface of the module substrate 22. The components may be mounted before the step of bonding the substrates 21 and 22.

The substrate unit 12 and the timepiece 10 having the above structure have a structure in which part of the module substrate 22 is superimposed on part of the mother substrate 21 and the substrates are bonded in a plurality of bonding portions 24 that define a plane, and thereby enables miniaturization of the substrate structure and secure bonding. Specifically, the cantilever structure thereof in which respective parts of the substrates are superimposed and bonded reduces the space required for bonding. In addition, the structure secures high supporting strength by the bonding portions 24 provided in a plurality of positions defining a plane, that is, a plurality of portions arranged in a row along with the end edge portions 21c and 22c, and a plurality of portions along the direction crossing the row direction at both ends thereof, in the present embodiment. In addition, the bonding structure using soldering suppresses the thickness required for bonding in comparison with a structure of connecting the entire surface via connectors.

Also, because the substrates are soldered in a region comprising end surfaces in each of the bonding portions 24, a larger bonding area is secured and a stereoscopic bonding structure is achieved. A curved surface formed in an end surface in each of the bonding portions 24 increases the bonding area, improves shock resistance and vibration resistance, and achieves secure bonding. In addition, the via holes 28 and 36 provided in the bonding pads 27 and 36 prevent the metal layer from peeling off.

The module substrate 22 and the mother substrate 21 are arranged so that they are superimposed in the superimposed portions 23 and extend to one side and the other side, respectively. This structure enables effective use of the spaces of both surfaces of the substrates 21 and 22. The module substrate 22 is disposed to correspond to the cut-out portion 21*a*. This structure enables mounting of various electronic components, such as the communication IC 34, on the other main surface of the module substrate 22.

In addition, the module substrate 22 of the present embodiment can be supported by bonding the module substrate 22 in predetermined positions provided on the outer circumference thereof. With this structure, the module substrate 22 is easily connected to the mother substrate 21 of various types and shapes comprising the superimposed portion 23 and the bonding portions 24, and secures high versatility. For example, a common substrate can be used even in the case of using electronic components that require individual authentications.

Figure 8:
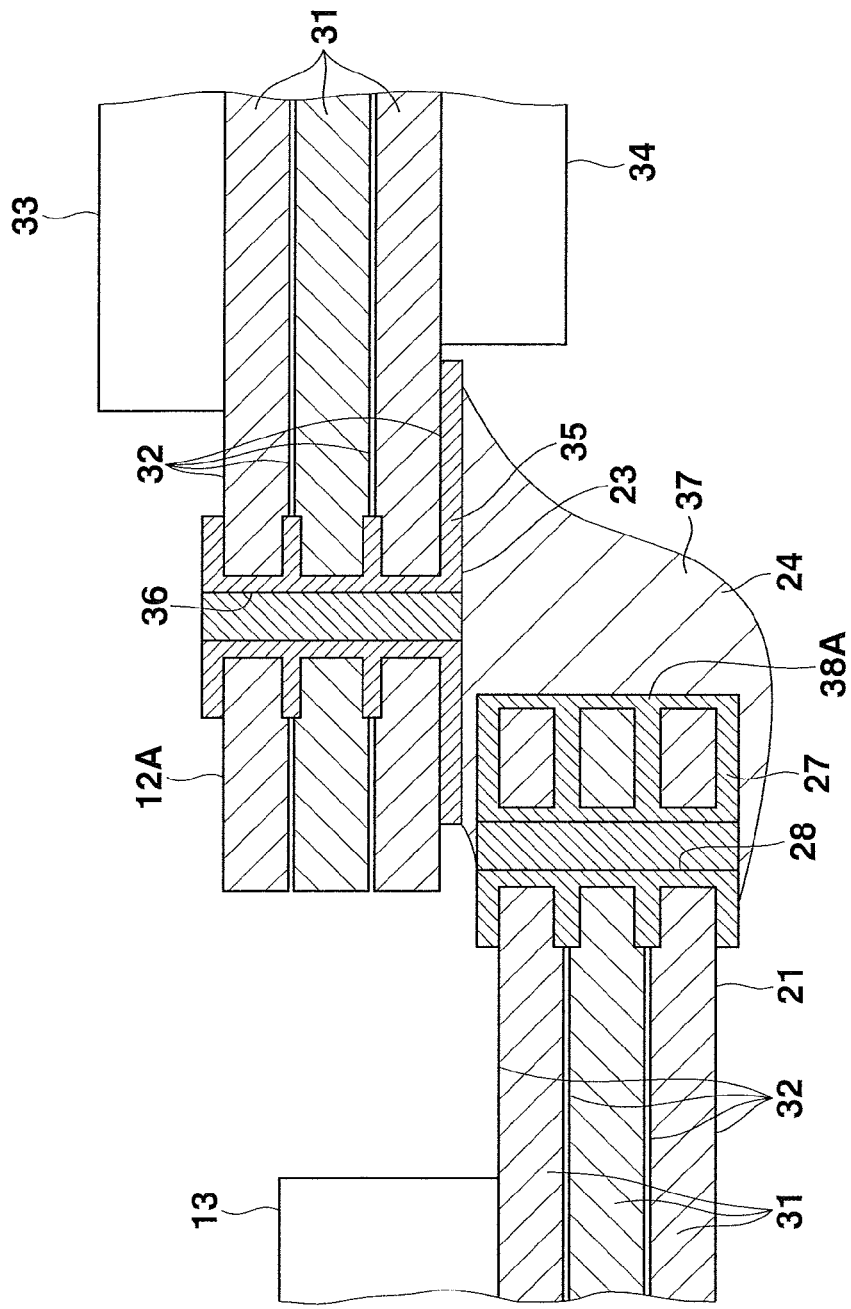
FIG. 8 is a cross-sectional view of a substrate unit according to another embodiment.

The embodiment described above has an arrangement in which the module substrate 22 is superimposed on the front surface (the dial 14 side) of the mother substrate 21, but the embodiment is not limited thereto. For example, as another embodiment, the module substrate 22 may be superimposed on and connected to the rear surface (the rear cover 16 side) of the mother substrate 21, as illustrated in FIG. 8. In this case, because the front surface of the module substrate 22 is located in the same position as that of the rear surface of the mother substrate 21, a height space for mounting electronic components is secured on the front side of the module substrate 22.

In the above embodiment, end surface metallization is performed on the module substrate 22 serving as one substrate, but the structure is not limited thereto. For example, the mother substrate 21 may be provided with the metal layer, or metal layers may be formed on end surfaces in the bonding portions 24 of both substrates 21 and 22.

The first via holes 28 and the second via holes 36 may be arranged in positions superimposed on each other and continuing in the stacking direction. This structure enables performing soldering on the first via hole 28 and the second via hole 36 together from one side in the stacking direction.

In the above embodiment, the substrate unit 12 is disposed with respect to the wristwatch case 11 so that the module substrate 22 is disposed in the three o'clock orientation of the wristwatch case 11, but the structure is not limited thereto. For example, as another embodiment, the module substrate 22 may be disposed in the twelve, six, or nine o'clock orientation. Specifically, the substrate unit 12 may be disposed in any orientation as long as the module substrate 22 is disposed in an orientation where no switches 17 are arranged.

In the above embodiment, the communication IC 34 is mounted on the rear surface of the module substrate 22, but the structure is not limited thereto. For example, as another embodiment, the communication IC 34 may be mounted on the front surface of the module substrate 22 in the same manner as the communication antenna.

In the above embodiment, the bonding portions 24 are arranged in a row along with the predetermined direction in the end edge portion 21*c*, and two bonding portions 24 are arranged in each of the projecting pieces 25, but the structure is not limited thereto. For example, as another embodiment, the end edge portion 21*c* may not have a straight-line shape, but may be provided with a stepped portion, and the bonding portions 24 may be formed on only both sides of the stepped portion. Specifically, the bonding portions bonding the mother substrate 21 to the module substrate 22 may be provided in any positions as long as the bonding portions are provided in a plurality of positions at least defining a plane in the superimposed portion 23.

In the above embodiment, the module substrate 22 is bonded to the mother substrate 21 on the dial 14 side, but the module substrate 22 may be bonded to the mother substrate 21 on the rear cover 16 side.

The above embodiment is illustrated as an example, and does not limit the scope of the invention.

Although some embodiments of the present invention have been described above, the present invention is comprised in the inventions described in the claims and equivalents thereof.

What is claimed is:

1. A substrate unit comprising:
   a first substrate; and
   a second substrate comprising a superimposed portion superimposed on at least part of the first substrate, and bonding portions bonded to the first substrate and located in a plurality of positions at least defining a plane in the superimposed portion,
   wherein the bonding portions are, in a bonded state between the first and second substrates, provided in an outer circumference of the second substrate corresponding to an outer circumference of the first substrate, and an outer circumference of the second substrate corresponding to an inside of the first substrate,
   wherein the first substrate comprises a recessed cut-out portion in part of an outer circumference thereof, and comprises a pair of projecting pieces projecting outward on both sides of the cut-out portion,
   wherein the bonding portions of the second substrate are superimposed on the projecting pieces, and
   wherein the first substrate extends from the superimposed portion to one side, the second substrate extends to the other side of the superimposed portion, and the outer circumference of the first substrate is configured to have a circular shape in a plan view in a bonded state.

2. The substrate unit according to claim 1,
   wherein the superimposed portion is provided in at least part of outer circumferential edges of the first substrate and the second substrate, and
   wherein the bonding portions are arranged in a row in one end edge of the second substrate, and in positions displaced from the row direction of the bonded portions in the end edge in both ends of another end edge.

3. The substrate unit according to claim 1,
   wherein each of the bonding portions is provided with a bonding pad having a metal layer, and
   wherein the metal layer is formed on an end surface of at least one of the substrates.

4. The substrate unit according to claim 2,
   wherein each of the bonding portions is provided with a bonding pad having a metal layer, and
   wherein the metal layer is formed on an end surface of at least one of the substrates.

5. The substrate unit according to claim 1, wherein at least one of the first substrate and the second substrate is a multi-layer substrate comprising a plurality of base materials and a plurality of wiring patterns, and a via is formed in each of the bonding portions.

6. The substrate unit according to claim 2, wherein at least one of the first substrate and the second substrate is a multi-layer substrate comprising a plurality of base materials and a plurality of wiring patterns, and a via is formed in each of the bonding portions.

7. The substrate unit according to claim 3, wherein at least one of the first substrate and the second substrate is a multi-layer substrate comprising a plurality of base materials and a plurality of wiring patterns, and a via is formed in each of the bonding portions.

8. The substrate unit according to claim 1, wherein the first substrate and the second substrate are soldered in the bonding portions, and solder is disposed between the first substrate and the second substrate in the superimposed portion.

9. The substrate unit according to claim 2, wherein the first substrate and the second substrate are soldered in the bonding portions, and solder is disposed between the first substrate and the second substrate in the superimposed portion.

10. The substrate unit according to claim 3, wherein the first substrate and the second substrate are soldered in the bonding portions, and solder is disposed between the first substrate and the second substrate in the superimposed portion.

11. The substrate unit according to claim 5, wherein the first substrate and the second substrate are soldered in the bonding portions, and solder is disposed between the first substrate and the second substrate in the superimposed portion.

12. The substrate unit according to claim 1,
wherein a watch module is mounted on the first substrate, and
wherein a communication integrated circuit and an antenna are mounted on the second substrate.

13. The substrate unit according to claim 2,
wherein a watch module is mounted on the first substrate, and
wherein a communication integrated circuit and an antenna are mounted on the second substrate.

14. A timepiece comprising the substrate unit according to claim 1.

* * * * *